(12) United States Patent
Cho

(10) Patent No.: US 7,630,235 B2
(45) Date of Patent: Dec. 8, 2009

(54) MEMORY CELLS, MEMORY DEVICES AND INTEGRATED CIRCUITS INCORPORATING THE SAME

(75) Inventor: Hyun-Jin Cho, Palo Alto, CA (US)

(73) Assignee: GlobalFoundries Inc., Grand Caymen (KY)

( * ) Notice: Subject to any disclaimer, the term of this patent is extended or adjusted under 35 U.S.C. 154(b) by 121 days.

(21) Appl. No.: 11/692,627

(22) Filed: Mar. 28, 2007

(65) Prior Publication Data

US 2008/0239803 A1 Oct. 2, 2008

(51) Int. Cl.
*G11C 11/34* (2006.01)

(52) U.S. Cl. ........................ 365/180; 365/159; 365/174; 365/175; 365/181

(58) Field of Classification Search .................. 365/180, 365/149, 174, 175, 212, 159; 257/107, 109, 257/137, 335, 750, 162, 133, 209, 288
See application file for complete search history.

(56) References Cited

U.S. PATENT DOCUMENTS

| | | | |
|---|---|---|---|
| 6,703,646 B1 * | 3/2004 | Nemati et al. ................ | 257/107 |
| 6,781,888 B1 * | 8/2004 | Horch et al. ........... | 365/189.09 |
| 7,037,763 B1 * | 5/2006 | Nemati et al. ................ | 438/133 |
| 7,078,739 B1 * | 7/2006 | Nemati et al. ................ | 257/107 |
| 7,123,508 B1 * | 10/2006 | Horch et al. ................. | 365/159 |
| 7,125,753 B1 * | 10/2006 | Horch et al. ................. | 438/135 |
| 7,209,384 B1 * | 4/2007 | Kim ........................... | 365/175 |
| 7,242,607 B2 * | 7/2007 | Kim ........................... | 365/149 |
| 7,268,373 B1 * | 9/2007 | Gupta et al. ................. | 257/162 |
| 7,304,327 B1 * | 12/2007 | Nemati et al. ............... | 257/162 |
| 7,460,395 B1 * | 12/2008 | Cho et al. .................... | 365/180 |
| 2005/0001232 A1 * | 1/2005 | Bhattacharyya ............. | 257/133 |
| 2005/0233506 A1 * | 10/2005 | Horch et al. ................. | 438/134 |
| 2007/0096203 A1 * | 5/2007 | Mouli ......................... | 257/330 |

OTHER PUBLICATIONS

Nemati, Farid et al., "Fully Planar 0.562µm2 T-RAM Cell in a 130 nm SOI CMOS Logic Technology for High-Density High Performance SRAMs," IEEE, ISBN: 0-7803-8684-1, pp. 273-276, Dec. 2004.
Cho, Hyun-Jin et al., "A Novel Capacitor-less DRAM Cell using Thin Capacitively-Coupled Thyristor (TCCT)," IEEE, ISBN: 0-7803-9268-x, pp. 311-314, Dec. 2005.
International Search Report for PCT/US2008/003362, mailed Jul. 2, 2008.

* cited by examiner

*Primary Examiner*—Anh Phung
*Assistant Examiner*—Thao Bui
(74) *Attorney, Agent, or Firm*—Ingrassia, Fisher & Lorenz, P.C.

(57) ABSTRACT

A memory cell is provided which includes an access transistor and a gated lateral thyristor (GLT) device. The access transistor includes a source node. The gated lateral thyristor (GLT) device includes an anode node coupled to the source node of the access transistor.

15 Claims, 15 Drawing Sheets

US 7,630,235 B2

MEMORY CELLS, MEMORY DEVICES AND INTEGRATED CIRCUITS INCORPORATING THE SAME

TECHNICAL FIELD

Embodiments of the present invention relate generally to semiconductor memory devices. More particularly, embodiments of the present invention relate to methods of fabricating gated lateral thyristor-based random access memory (GLTRAM) devices used in semiconductor memory devices, and to memory cell structures and memory devices which implement such GLTRAM devices.

BACKGROUND

Integrated circuit memories include static random access memory (SRAM). Many SRAM cell structures utilize six-transistor and four-transistor memory cells. The large layout areas associated with such six-transistor and four-transistor memory cells which are used in many implementations of SRAM cells has limited the design of high density SRAM devices.

Given these drawbacks, there have been attempts to build a thyristor-based memory cell to reduce layout area associated with conventional memory cells, and provide a thyristor-based memory cell having a simple layout. A thrysitor is a bi-stable, three terminal device which consists of a four layer structure including a P-type anode region, an N-type base, a P-type base, and an N-type cathode region arranged in a PNPN configuration. PN junctions are formed between P-type anode region and the N-type base, between the N-type base and the P-type base, and between the P-type base and the N-type cathode region. Contacts are made to the P-type anode region, the N-type cathode region, and the P-type base coupled to the gate electrode.

FIG. 1 is a circuit schematic 100 which illustrates an array of conventional thyristor-based Random Access Memory (TRAM) cells including TRAM cell 110.

As shown in FIG. 1, TRAM cell 110 consists of a word lines 120, 130, a bit line 150, a Thin Capacitively-Coupled Thyristor (TCCT) device 160 in series with an NMOS access transistor 170. The TCCT device 160 provides an active storage element which comprises a thyristor and a capacitor coupled to the gate of the thyristor. The NMOS access transistor 170 is coupled between a cathode node 146 of the TCCT device 160 and the bit line 150. An anode node 148 of the TCCT device 160 is fixed at a positive bias. The TCCT device 160 exhibits a bi-stable current-versus-voltage (I-V) characteristic. The bi-stable current-versus-voltage (I-V) characteristic results in a wide read margin between logical one (1) and logical zero (0) data states because the on/off current ratio between two states are greater than $1\times10^5$. The bi-stable current-versus-voltage (I-V) characteristic results in good read current because at a logical one (1) data state, TCCT device 160 is in forward diode mode resulting in higher current. The T-RAM cell 110 can make it difficult to maintain good retention and disturb characteristics because the retention of the T-RAM cell 110 is sensitive to leakage currents of the NMOS access transistor 170 which are hard to control.

FIG. 2 is a circuit schematic 200 which illustrates an array of conventional Thin Capacitively-Coupled Thyristor (TCCT)-DRAM cells including TCCT-DRAM cells 210, 270. In contrast to conventional DRAM cells, which usually include a MOSFET device and a capacitor, the TCCT-DRAM cell 210 consists of a single TCCT device 260 and three controls lines including a write enable line 230, word line 240, bit line 250. The TCCT device 260 consists of a thyristor (not labeled in FIG. 2) which includes an anode node 248 connected to the bit line 250, a cathode node 246 connected to the word line 240, and a gate capacitor (not shown) connected directly above a P-base region of the thyristor to a gate line which functions as the write enable line 230. The TCCT-DRAM cell 210 is operated using basic read/write operations which include a standby mode, a write logic one (1) operation, a write logic zero (0) operation, and a read operation.

In standby mode, both bit line 250 and word line 240 are at Vdd and the stored cell data is maintained by the charge state of the P-base region of thyristor. The word line 240 functions as the word line in TCCT DRAM, and activates the TCCT cells connected along the write enable line 230. During a write logic one (1) operation, the write enable line 230 is pulsed while word line 240 is held at ground level, triggering the TCCT device 260 to latch. The bias scheme for write zero (0) operation is the same as the write one (1) operation except that the voltage applied on the bit line 250 is kept low so that the pulsing of the write enable line 230 switches the TCCT device 260 into its blocking state. During a read operation, the word line 240 is held low and the change in the voltage or the current of the bit line 250 is read into a sense amplifier.

Although the TCCT-DRAM cell 210 does not require an access transistor, operation of the TCCT-DRAM cell 210 suffers from disturbance problems such as charge loss during a write zero operation. For example, when one TCCT-DRAM cell 210 is selected for a write zero operation, a bias level on the bit line 250 must decrease to ground which, in turn, can make an unselected TCCT-DRAM cell 270 lose charge through the bit line 250.

Accordingly, there is a need for memory devices and memory cell structures which can help to resolve such issues, and methods for fabricating those memory devices and memory cell structures.

BRIEF SUMMARY

According to one embodiment, a memory cell is provided which includes an access transistor and a gated lateral thyristor (GLT) device. The access transistor includes a source node. The gated lateral thyristor (GLT) device includes an anode node coupled to the source node of the access transistor.

BRIEF DESCRIPTION OF THE DRAWINGS

A more complete understanding of the present invention may be derived by referring to the detailed description and claims when considered in conjunction with the following figures, where:

FIGS. 5, 6, 12-14 and 11 illustrate, in cross section, the memory cell and method steps for its fabrication in accordance with alternate embodiments of the invention.

DETAILED DESCRIPTION

The following detailed description is merely exemplary in nature and is not intended to limit the invention or the application and uses of the invention. The word "exemplary" is used herein to mean "serving as an example, instance, or illustration." Any embodiment described herein as "exemplary" is not necessarily to be construed as preferred or advantageous over other embodiments. All of the implementations described below are exemplary implementations provided to enable persons skilled in the art to make or use the invention and are not intended to limit the scope of the invention which is defined by the claims. Furthermore, there is no intention to be bound by any expressed or implied theory presented in the preceding technical field, background, brief summary or the following detailed description.

For the sake of brevity, conventional techniques related to transistor design and manufacturing, the control of memory devices, memory cell programming, memory cell erasing, and other functional aspects of the devices and systems (and the individual operating components of the devices and systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the invention.

The following description refers to elements or nodes or features being "connected" or "coupled" together. As used herein, unless expressly stated otherwise, "connected" means that one element, node or feature is directly joined to (or directly communicates with) another element, node or feature. Likewise, unless expressly stated otherwise, "coupled" means that one element, node or feature is directly or indirectly joined to (or directly or indirectly communicates with) another element, node or feature.

In the description and the claims, numerical ordinals, such as the terms "first," "second," "third," "fourth," if any, may be used for distinguishing between similar elements and not necessarily for describing a particular sequential or chronological order. It is to be understood that the terms so used are interchangeable. Under appropriate circumstances, embodiments of the invention described herein are capable of fabrication or operation in sequences other than those illustrated or otherwise described herein.

Furthermore, the terms "comprise," "include," "have," and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus.

Figure 1:
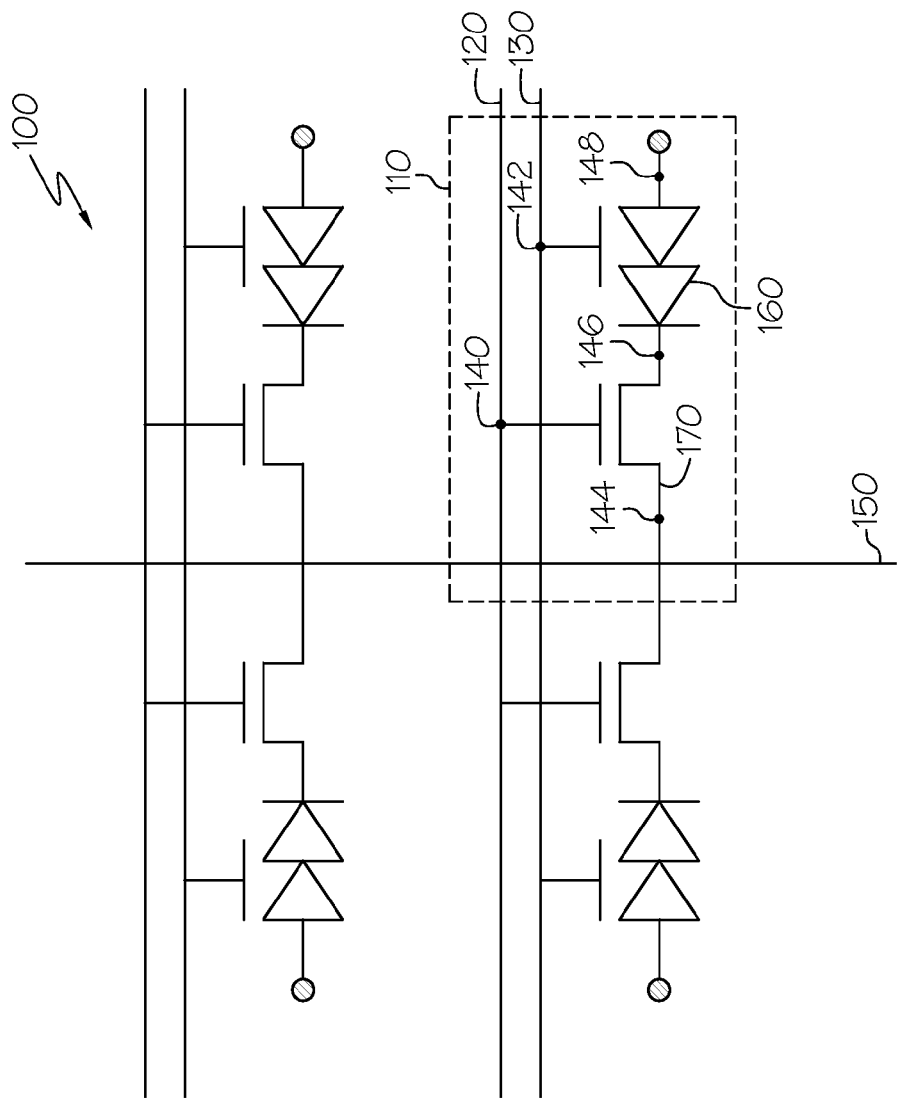
FIG. 1 is a circuit schematic which illustrates an array of conventional thyristor-based Random Access Memory (TRAM) cells.
Figure 2:
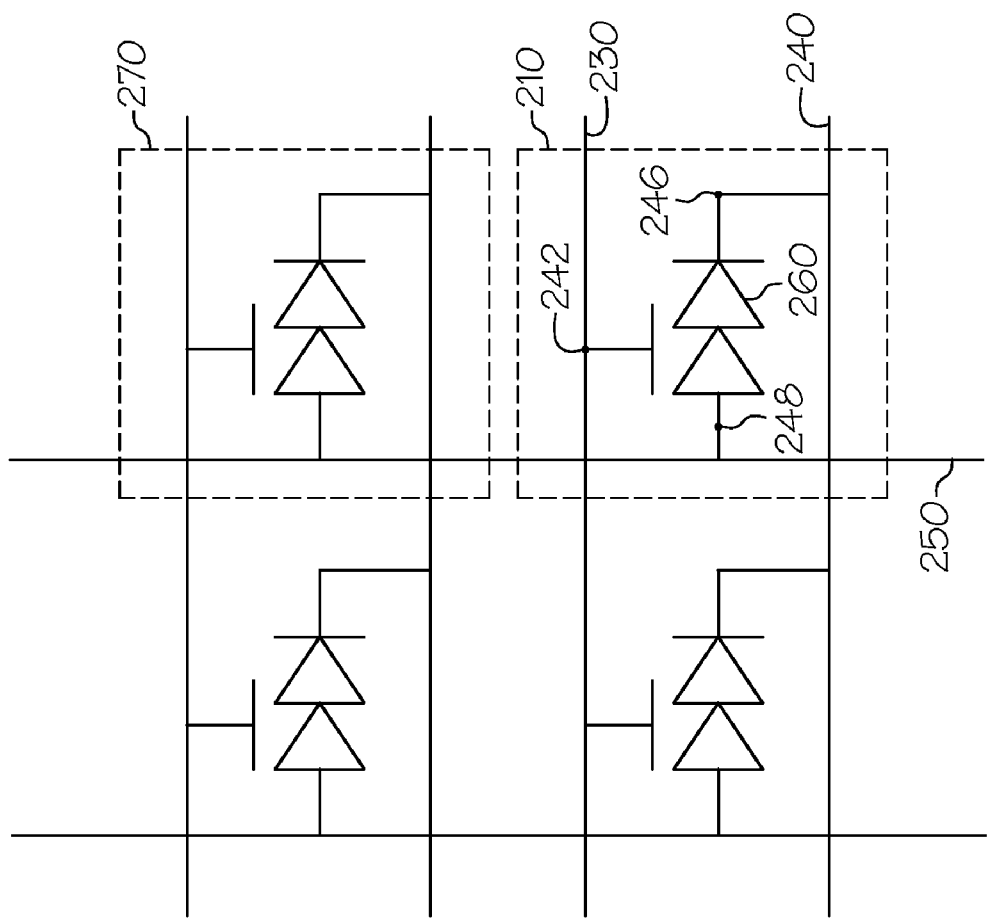
FIG. 2 is a circuit schematic which illustrates an array of conventional Thin Capacitively-Coupled Thyristor (TCCT)-DRAM cells.
Figure 3:
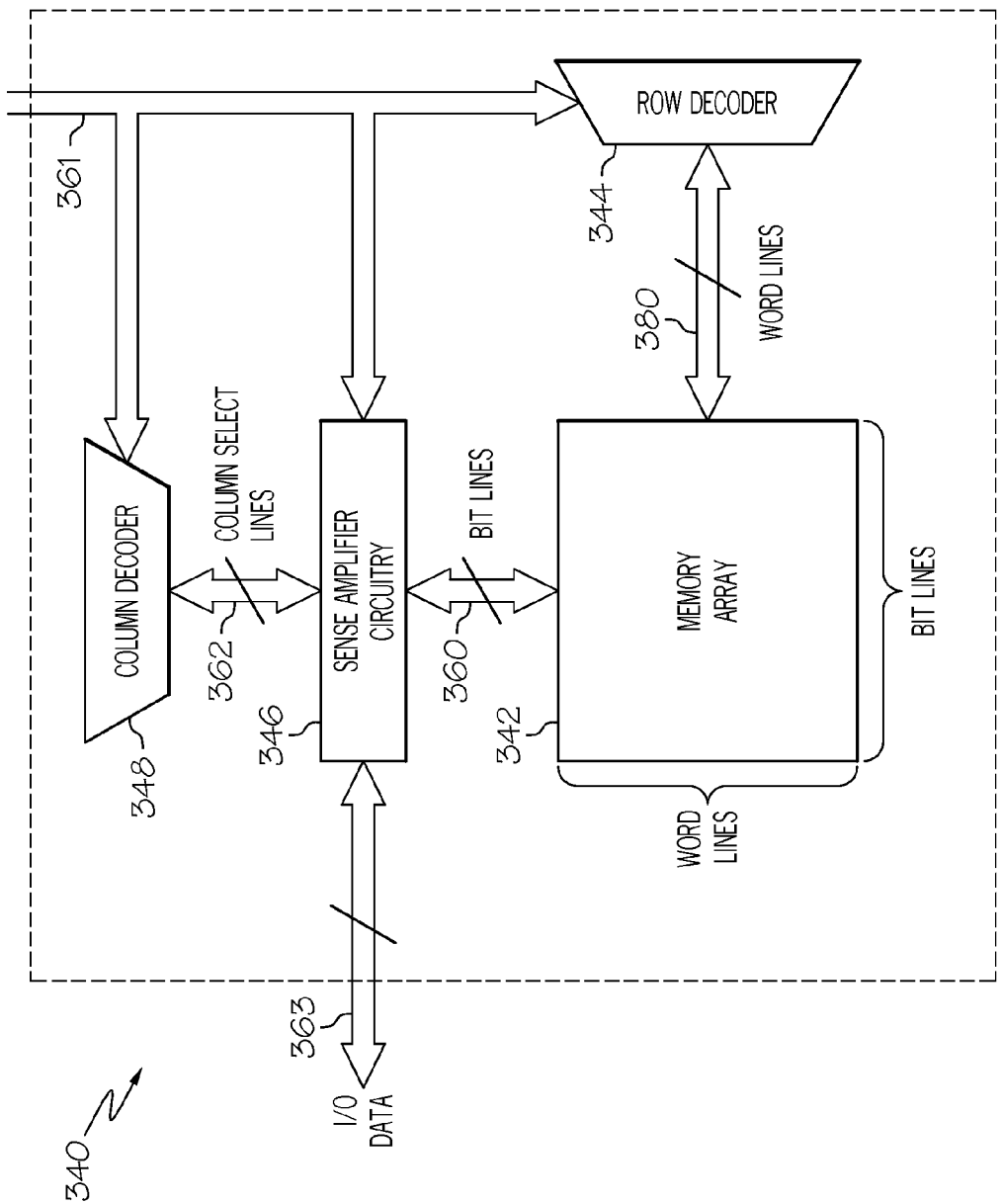
FIG. 3 is a block diagram of a memory system which can be used with embodiments of the present invention.

FIG. 3 is a block diagram of a memory system 340 which can be used with embodiments of the present invention. The memory system 340 is a simplified representation of an exemplary embodiment, and an actual system 340 may also include conventional elements, logic, components, and functionality not shown in FIG. 3. The memory system 340 can perform operations including write one (1), read one (1), write zero (0), and read zero (0)) with respect to a memory array 342.

The memory system 340 includes the memory array 342 which comprises a plurality of memory cells whose word lines and bit lines are commonly arranged into rows and columns, respectively, row and column decoders 344, 348 and sense amplifier circuitry 346. The memory array 342 includes a plurality of memory cells 300. Each memory cell is designated with a row address and column address. For a particular memory cell, a particular word line controls access to its particular storage element by allowing or preventing the signal (representing a logic "0" or a logic "1") carried on a particular bit line to be written to or read from the storage element. Thus, each memory cell 100 can store one bit of data as a logical "0" or logical "1."

The bit lines of the memory array 342 can be connected to the sense amplifier circuit 346, while its word lines can be connected to the row decoder 344. Address and control signals are input on address/control lines 361 into the memory system 340. The address/control lines 316 are connected to the column decoder 348, sense amplifier circuit 346 and row decoder 344. The address/control lines 316 are used to gain read and write access, among other things, to the memory array 342.

The column decoder 348 is connected to the sense amplifier circuit 346 via control and column select signals on column select lines 362. The sense amplifier circuitry 346 receives input data destined for the memory array 342 and outputs data read from the memory array 342 over input/output (I/O) data lines 363. Data is read from the cells of the memory array 342 by activating a word line (via the row decoder 344), which couples all of the memory cells corresponding to that word line to respective bit lines 360, which define the columns of the array. One or more bit lines are also activated. When a particular word line and bit lines are activated, thereby selecting a bit or bits, the sense amplifier circuitry 346 connected to a bit line detects and amplifies the data is the selected bit by measuring the potential difference between the activated bit line and a reference line.

Figure 4:
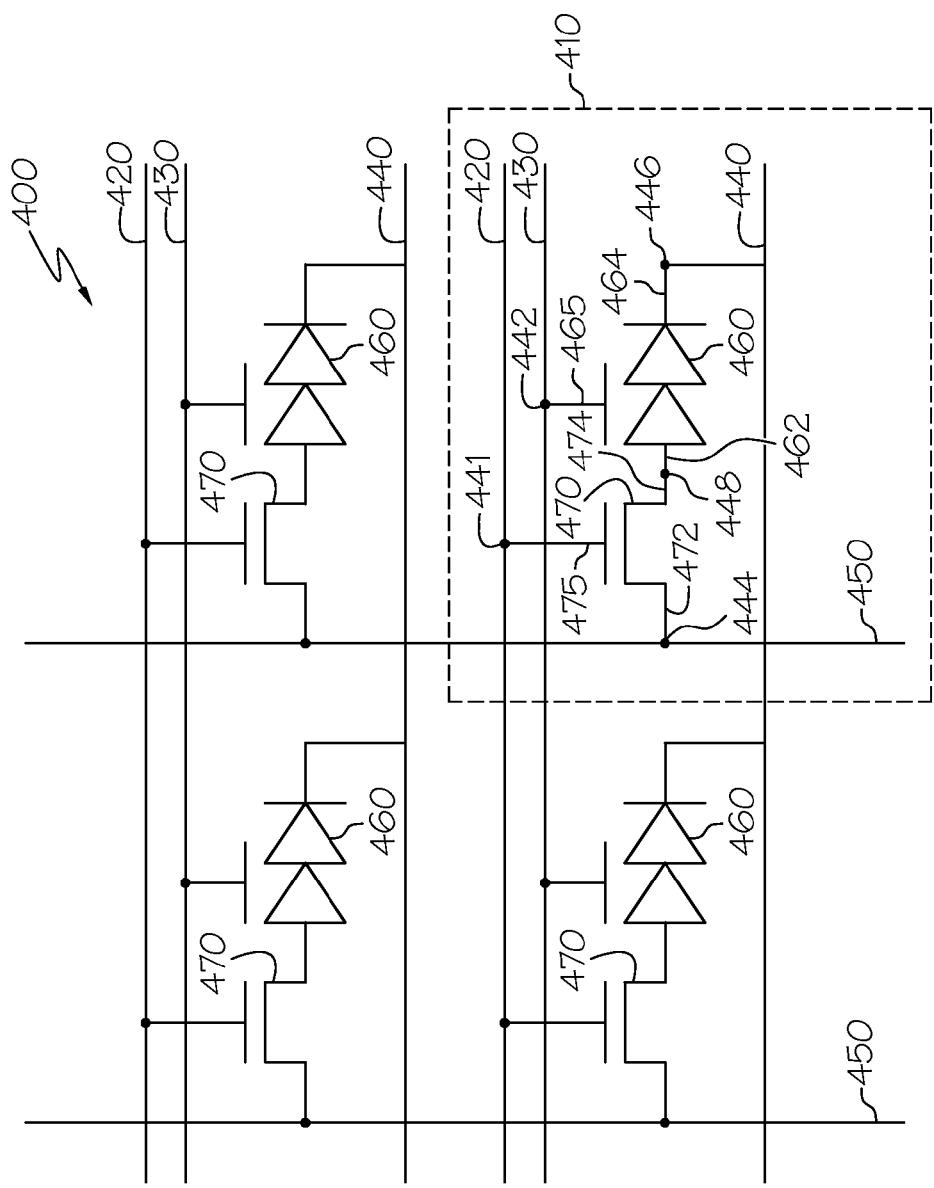
FIG. 4 is a circuit schematic which illustrates an array of memory cells in accordance with an embodiment of the present invention.

FIG. 4 is a circuit schematic which illustrates an array 400 of memory cells in accordance with an embodiment of the present invention. In one embodiment, the memory array 400 can be implemented as part of the memory array 342 of the memory system 340 illustrated in FIG. 3. In FIG. 4, the array 400 is illustrated as including a block of four memory cells which are of identical construction and configured as two rows by two columns. While the memory cell array 400 shown in FIG. 4 illustrates only four memory cells, it will be appreciated by those skilled in the art that in many practical implementations, such as, a TRAM, SRAM or DRAM integrated circuit or NAND or NOR type flash memory, a memory cell array 400 can include thousands or more of such memory cells. In the following description, one of the memory cells, namely memory cell 410, will be described even though three other memory cells are illustrated in FIG. 4, each of which comprise the same structure as memory cell 410.

The memory cell 410 comprises a gated lateral thyristor (GLT) device 460 and a MOSFET access transistor 470. A plurality of control lines are used to operate the memory cell 410 including a first word line 420, a second word line 430, a third word line 440, and a bit line 450.

The MOSFET access transistor 470 can comprise either an NMOS access transistor or a PMOS access transistor depending on the implementation. Moreover, although the term "MOSFET" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate (whether silicon or other semiconductor material).

Figure 11:
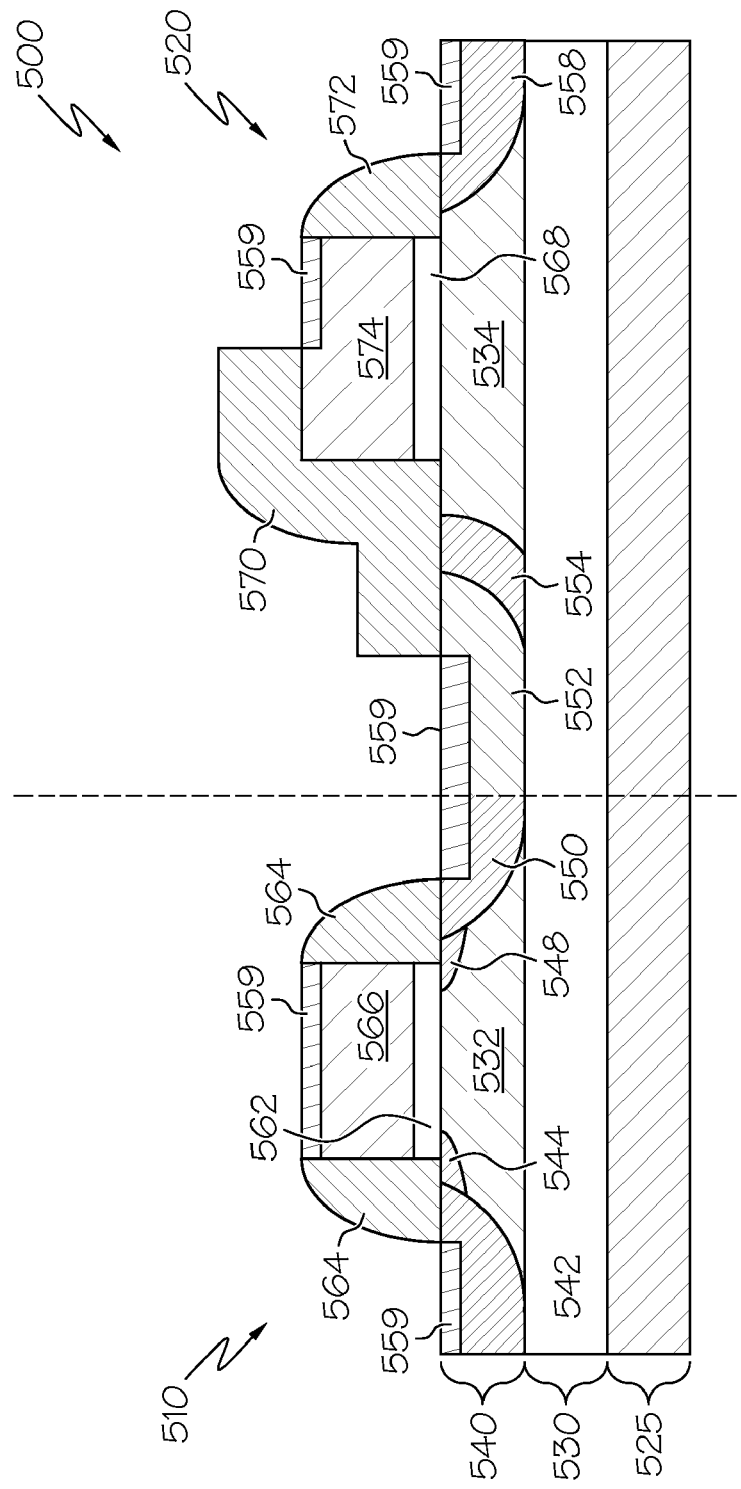

The GLT device is represented by symbol 460 in FIG. 4. Although not shown, it is to be understood that the GLT device 460 comprises a thyristor (not shown) and a Metal Oxide Silicon (MOS) capacitor (not shown) connected to the thyristor, as shown in FIG. 11. In general, the thyristor is a bi-stable, three terminal device which comprises a gate electrode 465, an anode region 462, a cathode region 464, and a pair of base regions (not shown) disposed between the anode region 462 and cathode region 464. Contacts are made: to the anode region 462 to create an anode terminal, to the cathode region 464 to create a cathode terminal, and to the gate electrode 465 to create a gate terminal. PN or NP junctions formed between the anode region 462 and one of the base regions, between the pair of base regions, and between the other one of the base regions and the cathode region 464. In GLT device 460, which is represented by symbol 460 in FIG. 4, the MOS capacitor (not shown) is connected to one of the base regions of the thyristor (not shown).

In one exemplary embodiment of the memory cell 410, which will be described below with respect to FIGS. 5-11, the MOSFET access transistor 470 comprises an NMOS access transistor, and the GLT device 460 comprises a PNPN thyristor (not labeled in FIG. 4) coupled to a MOS capacitor (not labeled in FIG. 4). The PNPN thyristor includes a gate electrode 465, a P-type anode region 462, an N-type base region (not shown), a P-type base region (not shown) and an N-type cathode region 464 arranged in a PNPN configuration, where the N-type and P-type base regions are laterally disposed between the P-type anode region 462 and N-type cathode region 464. As above, contacts are made to the P-type anode region 462, to the N-type cathode region 464, and to the gate electrode 465. A PN junction is formed between P-type anode region 462 and the N-type base region, another PN junction is formed between the N-type base region and the P-type base region, and yet another PN junction is formed between the P-type base and the N-type cathode region 464. In these embodiments, the P-type anode region/N-type base region and the P-type base region/N-type cathode region function as a bipolar device. The MOS capacitor of the GLT device 460 includes a gate electrode 465, the P-type base region, and a gate insulator layer disposed between the gate electrode 465 and the P-type base region. The gate insulator layer serves as the capacitor dielectric. The N-type base region and the P-type base region are adjacent one another. The MOS capacitor is connected to the P-base region of the thyristor. In an alternative exemplary embodiment, the MOSFET access transistor 470 comprises a PMOS access transistor, and the GLT device 460 comprises a thyristor coupled to a MOS capacitor. In this alternative embodiment, the thyristor comprises a bipolar device arranged in an NPNP configuration, and the MOS capacitor is connected to an N-base of the bipolar device.

The MOSFET access transistor 470 comprises a source region 474 coupled to the anode terminal 462 of the GLT device 460 at node 448, a drain region 472 coupled to the bit line 450 at node 444, and a gate electrode 475 coupled to the first word line 420 at node 441.

FIGS. 5-11 illustrate, in cross section, a memory cell 500 and method steps for its fabrication in accordance with various embodiments of the invention. Those of skill in the art will understand that memory cell 500 is likely to be one of a large number of memory cells that are interconnected in an integrated circuit. In one embodiment, the memory cell 500 can be implemented as one of the memory cells within the memory array 400 illustrated in FIG. 4. In the illustrative embodiments which are described below, the exemplary memory cell 500 comprises an N-channel MOS (NMOS) access transistor 510 and a GLT device 520 which comprises a PNPN thyristor coupled to a MOS capacitor. However, as will be explained below, similar method steps can be used to manufacture another memory cell comprising a P-channel MOS (PMOS) access transistor and a GLT device which comprises a NPNP thyristor coupled to a MOS capacitor.

Various steps in the manufacture of memory cells, MOS transistors and thyristors are well known and so, in the interest of brevity, many conventional steps will only be mentioned briefly herein or will be omitted entirely without providing the well known process details. As noted above, as used herein, the term "MOS transistor" is to be interpreted non-restrictively and refers to any semiconductor device that includes a conductive gate electrode that is positioned over a gate insulator which, in turn, is positioned over a semiconductor substrate.

Figure 5:
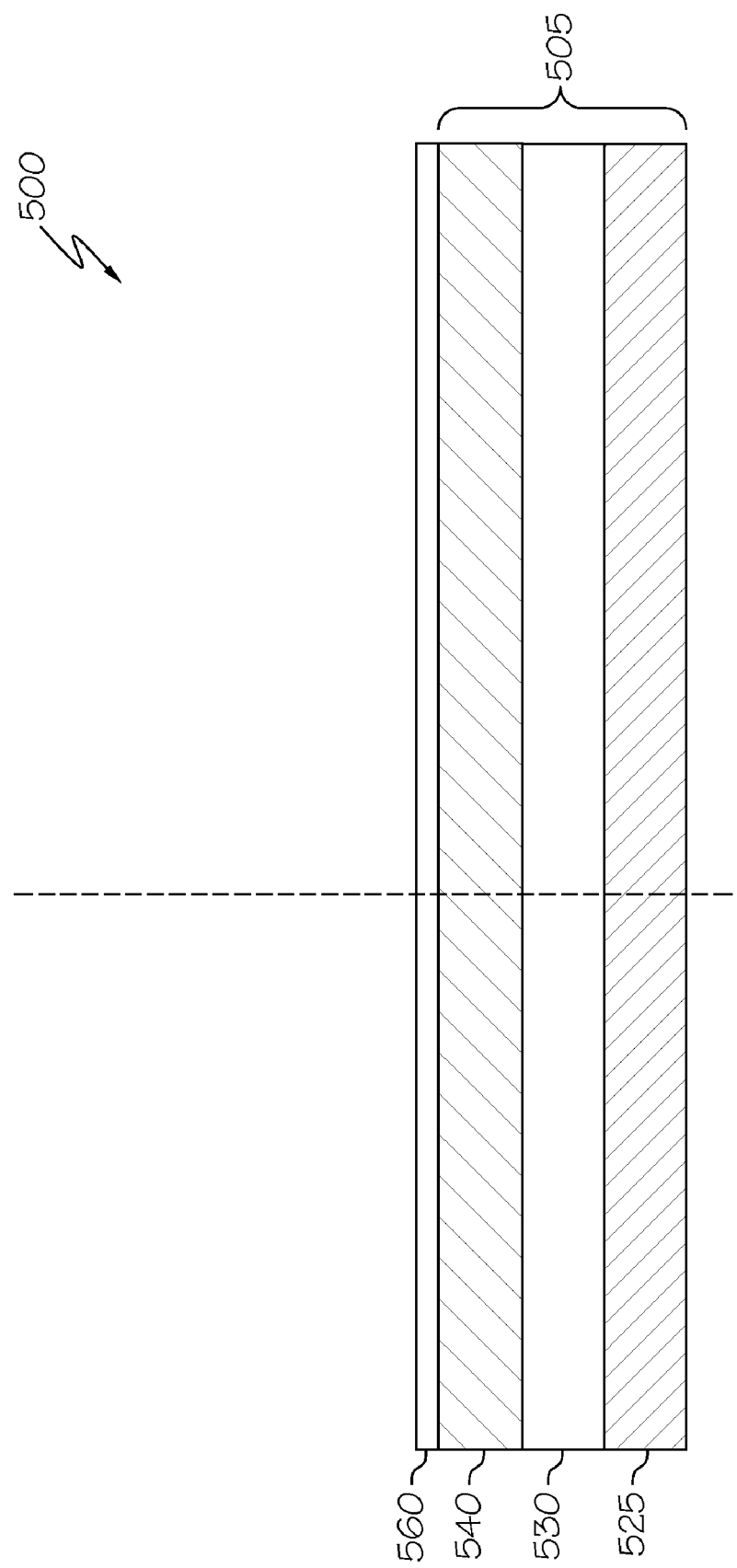
FIGS. 5-11 illustrate, in cross section, a memory cell and method steps for its fabrication in accordance with various embodiments of the invention.

The initial steps in the fabrication of memory cell 500 are conventional so the structure resulting from these steps is illustrated in FIG. 5, but the initial steps themselves are not shown and will not be described in detail. The manufacture begins with providing a semiconductor structure or substrate 505 in and on which a memory cell 500 is fabricated. The semiconductor substrate 505 can be either a bulk semiconductor material or a semiconductor-on-insulator (SOI) substrate. In accordance with an embodiment of the invention illustrated in FIG. 5, the semiconductor substrate 505 is illustrated as a (SOI) structure 505 which comprises at least one thin layer of semiconductor material 540 disposed on or over a buried oxide insulating layer 530 which, in turn, is supported by a carrier wafer or substrate 525 so that the buried oxide insulating layer 530 is disposed between the carrier wafer 525 and the semiconductor layer 540. Those of skill in the semiconductor art will appreciate that the semiconductor layer 540 can be a silicon layer, a germanium layer, a gallium arsenide layer, or other semiconductor materials. In one embodiment, the semiconductor layer 540 comprises a thin monocrystalline layer of silicon on the buried oxide insulating layer 530. The thin monocrystalline layer of silicon can be a silicon substrate having a (100) surface crystal orientation. The thin silicon layer preferably has a resistivity of at least about 1-35 Ohms per square. As used herein, the term "silicon layer" will be used to encompass the relatively pure silicon materials or lightly impurity-doped monocrystalline silicon materials typically used in the semiconductor industry as well as silicon admixed with small amounts of other elements such as germanium, carbon, and the like, as well as impurity dopant elements such as boron, phosphorus, and arsenic, to form a substantially monocrystalline semiconductor material. In one embodiment, the buried oxide insulating layer 530 can be, for example, a silicon dioxide layer, which preferably has a thickness of about 50-200 nm.

An optional protective oxide layer 560 can be deposited over the semiconductor layer 540 to protect the semiconductor layer 540 from damage and to help control implantation depth during subsequent implantation steps. In one embodiment, the protective oxide layer 560 can be, for example, a silicon dioxide layer, which preferably has a thickness of about 10-20 nm.

Figure 6:
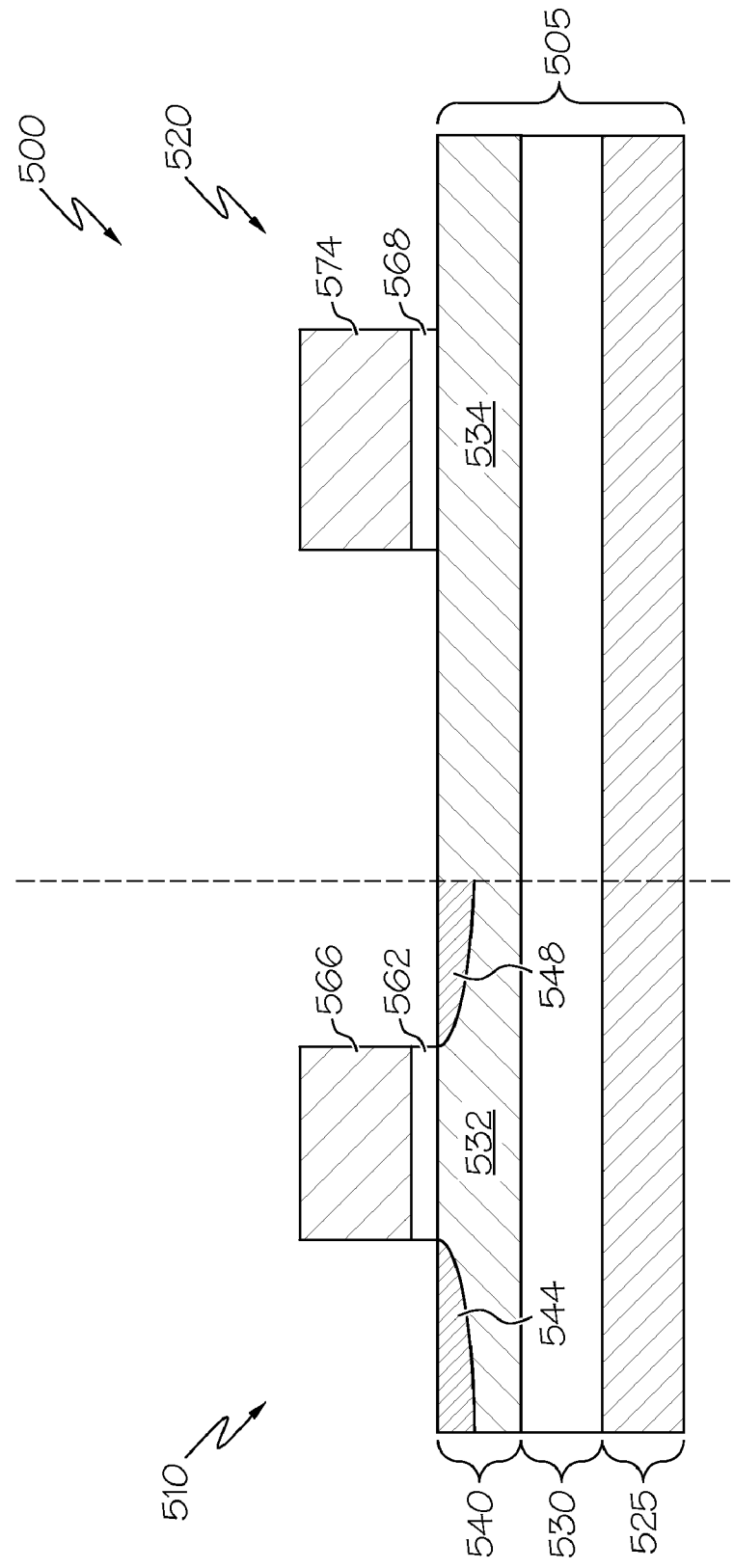

As illustrated in FIG. 6, at least a surface portion of the semiconductor layer 540 can be impurity doped either with N-type conductivity determining impurities or P-type conductivity determining impurities depending on the conductivity type of the MOS transistor 510. In the NMOS embodiment of the transistor illustrated in FIG. 6, the semiconductor layer 540 is doped with P-type conductivity determining impurities to create P-well regions 532, 534 in the semiconductor layer 540. Impurity doping can take place, for example, by the implantation and subsequent thermal annealing of dopant ions such as boron. In a PMOS embodiment (not illustrated in FIG. 6), the semiconductor layer can be doped with N-type conductivity determining impurities to create N-well regions (not shown) in the semiconductor layer 540. Impurity doping can take place, for example, by the implantation and subsequent thermal annealing of dopant ions such as phosphorus and arsenic.

Once the P-well regions 532, 534 are formed, portions of the protective oxide layer 560 can be selectively removed, and trenches can be etched into the semiconductor layer 540 for the formation of dielectric isolation regions (not shown) between adjacent memory cells. For example, the memory cell 500 can be electrically isolated from other memory cells (not shown) by a dielectric isolation region (not shown), preferably a shallow trench isolation (STI) region. As is well known, there are many processes that can be used to form the STI, so the process need not be described here in detail. In general, STI includes a shallow trench that is etched into the surface of the semiconductor layer 540 that is subsequently filled with an insulating material. After the trench is filled with an insulating material, such as an oxide, the surface is usually planarized, for example by chemical mechanical planarization (CMP).

A layer of gate insulating material 562 is formed at the surface of the impurity-doped regions and gate electrodes 566, 574 are formed overlying the gate insulating material 562 and impurity-doped P-well regions 532, 534, respectively. The layer of gate insulating material 562 can be a layer of thermally grown silicon dioxide or, alternatively, a deposited insulator such as silicon oxide, silicon nitride, or a high dielectric constant (κ) insulator material having a high dielectric constant (κ) relative to silicon dioxide. Examples of "high-κ dielectric" materials include hafnium and zirconium silicates, and their oxides, including, but not limited to, hafnium oxide ($HfO_2$), hafnium silicate (HfSiO), or the like. Deposited insulators can be deposited, for example, by chemical vapor deposition (CVD), low pressure chemical vapor deposition (LPCVD), plasma enhanced chemical vapor deposition (PECVD) or atomic layer deposition (ALD). The deposited gate insulator layer 562 preferably has a thickness of about 1-10 nm, although the actual thickness can be determined based on the circuit being implemented.

Gate electrodes 566, 574 are preferably formed by depositing, patterning, and etching a layer of metal or polycrystalline silicon, preferably a layer of undoped polycrystalline silicon. The gate electrodes 566, 574 are formed over the P-well regions 532, 534 in the semiconductor layer 540 and generally have a thickness of about 100-300 nm. The polycrystalline silicon can be deposited, for example, by the reduction of silane ($SiH_4$) in a CVD reaction such as a low pressure chemical vapor deposition (LPCVD).

After the gate electrodes 566, 574 have been formed, a mask layer (not shown) can optionally be formed over the gate electrode 574, and at least a surface portion of the P-well region 532 can be impurity doped with N-type conductivity determining impurities to create lightly doped extension regions 544, 548 in the semiconductor layer 540 adjacent the gate insulator layer 562. Impurity doping can take place, for example, by the implantation and subsequent thermal annealing of dopant ions such as arsenic. In a PMOS embodiment (not illustrated in FIG. 6), the semiconductor layer 540 can be doped with P-type conductivity determining impurities to create lightly doped extension regions in the semiconductor layer 540. Impurity doping can take place, for example, by the implantation and subsequent thermal annealing of dopant ions such as boron di-flouride ($BF_2$).

In accordance with one embodiment the method continues in accordance with FIGS. 7-11. The method in accordance with another embodiment continues as illustrated in FIGS. 12-14 and 11.

Figure 7:
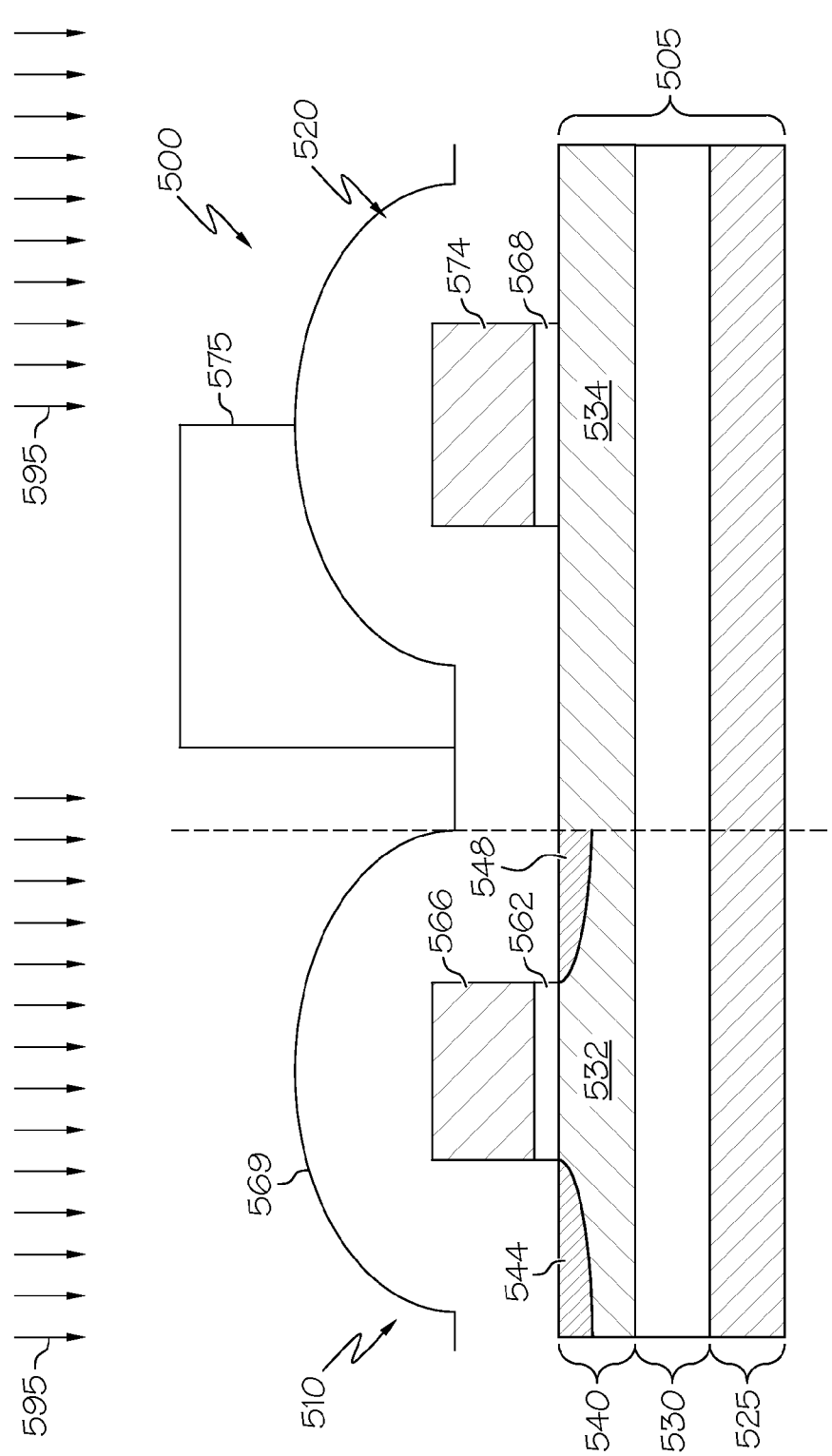

As illustrated in FIG. 7, a blanket layer of insulating material 569, such as a dielectric layer of silicon oxide and/or silicon nitride, is conformally deposited overlying the gate electrodes 566, 574 and exposed portions of the semiconductor layer 540 including the lightly doped extension regions 544, 548. A layer of photosensitive material, such as photoresist, is then applied over the blanket layer of insulating material 569, and is patterned to leave a remaining portion 575 and to expose selected portions of the blanket insulating layer 569. The exposed portions of the blanket insulating layer 569 are then anisotropically etched (with etchants represented by the arrows 595), for example, by reactive ion etching (RIE). Silicon oxide and silicon nitride can be etched, for example, in a $CHF_3$, $CF_4$, or $SF_6$ chemistry.

Figure 8:
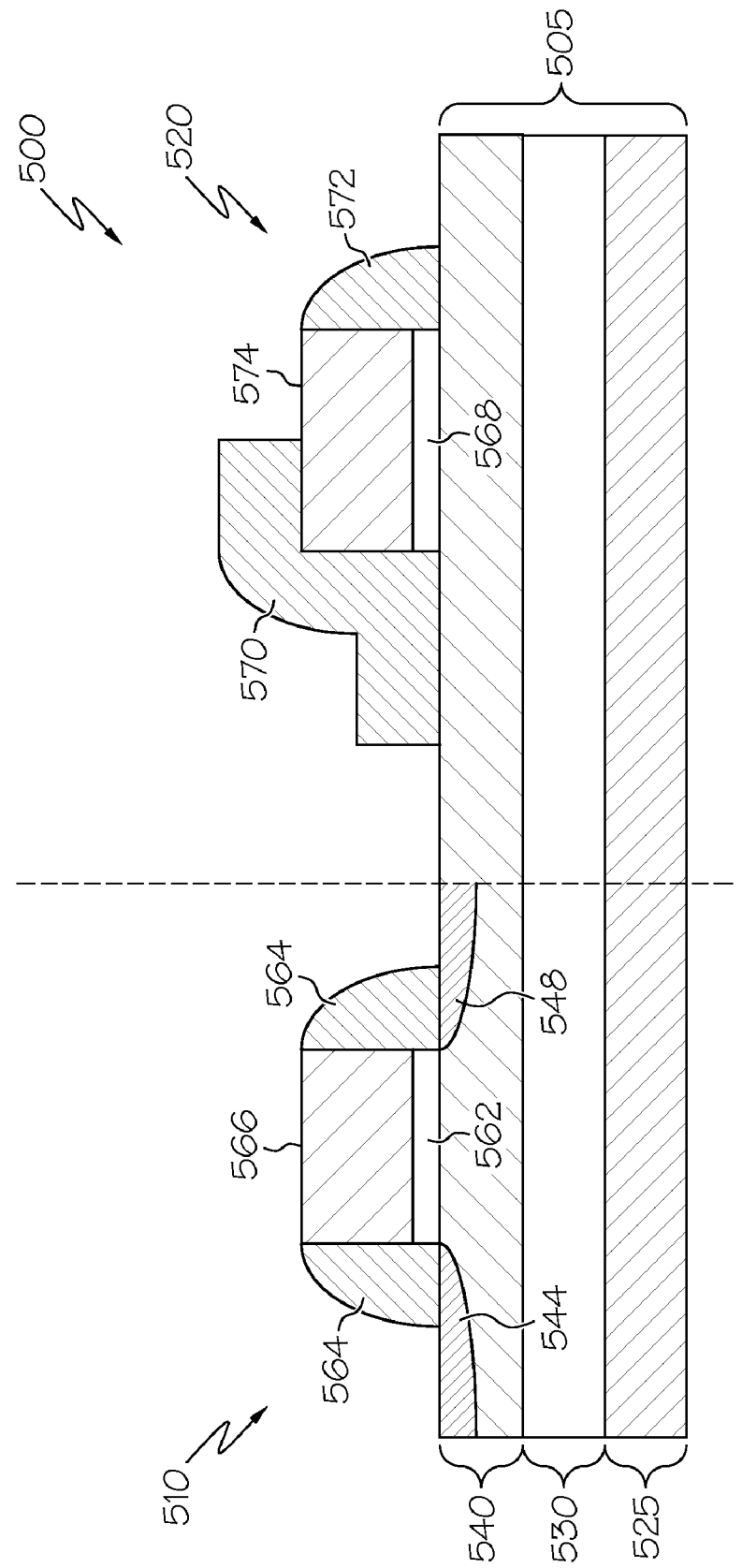

As illustrated in FIG. 8, the blanket layer of insulating material 569 is anisotropically etched to form sidewall spacers 564 on sidewalls of gate electrode 566 and to form a sidewall spacer 572 and an insulating spacer block 570 on sidewalls of gate electrode 574. The insulating spacer block 570 overlies a portion of the semiconductor layer 540, a portion of gate electrode 574, and a sidewall of gate electrode 574. The remaining portion 575 of the photosensitive material is then removed after implantation.

Figure 9:
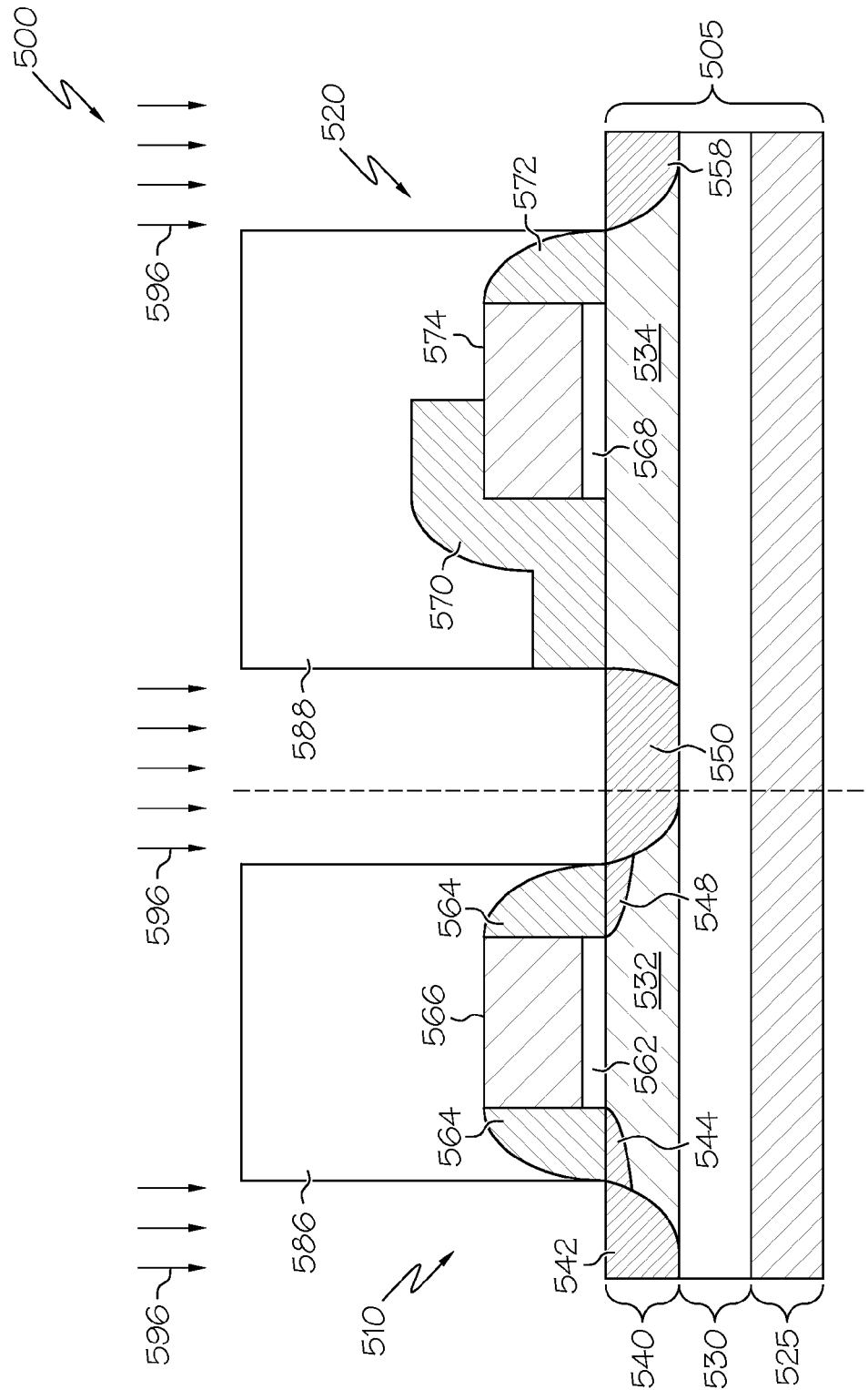

As illustrated in FIG. 9, a layer of masking material 586, 588, which can be, for example, a layer of photoresist, is then applied over the gate electrodes 566, 574. The layer of masking material is then patterned to provide an ion implant mask which exposes regions of the semiconductor layer 540 which correspond to the eventual locations of the drain region 542, the source/base region 550, and the cathode region 558. The drain region 542, source/base region 550, and cathode region 558 are implanted as represented by the arrows 596. In this exemplary embodiment, N-type conductivity determining ions, such as phosphorus or arsenic, are implanted. In an alternate embodiment, P-type conductivity determining ions, such as boron, can be implanted into the exposed regions of the semiconductor layer. The layer of masking material 586, 588 is then removed.

Figure 10:
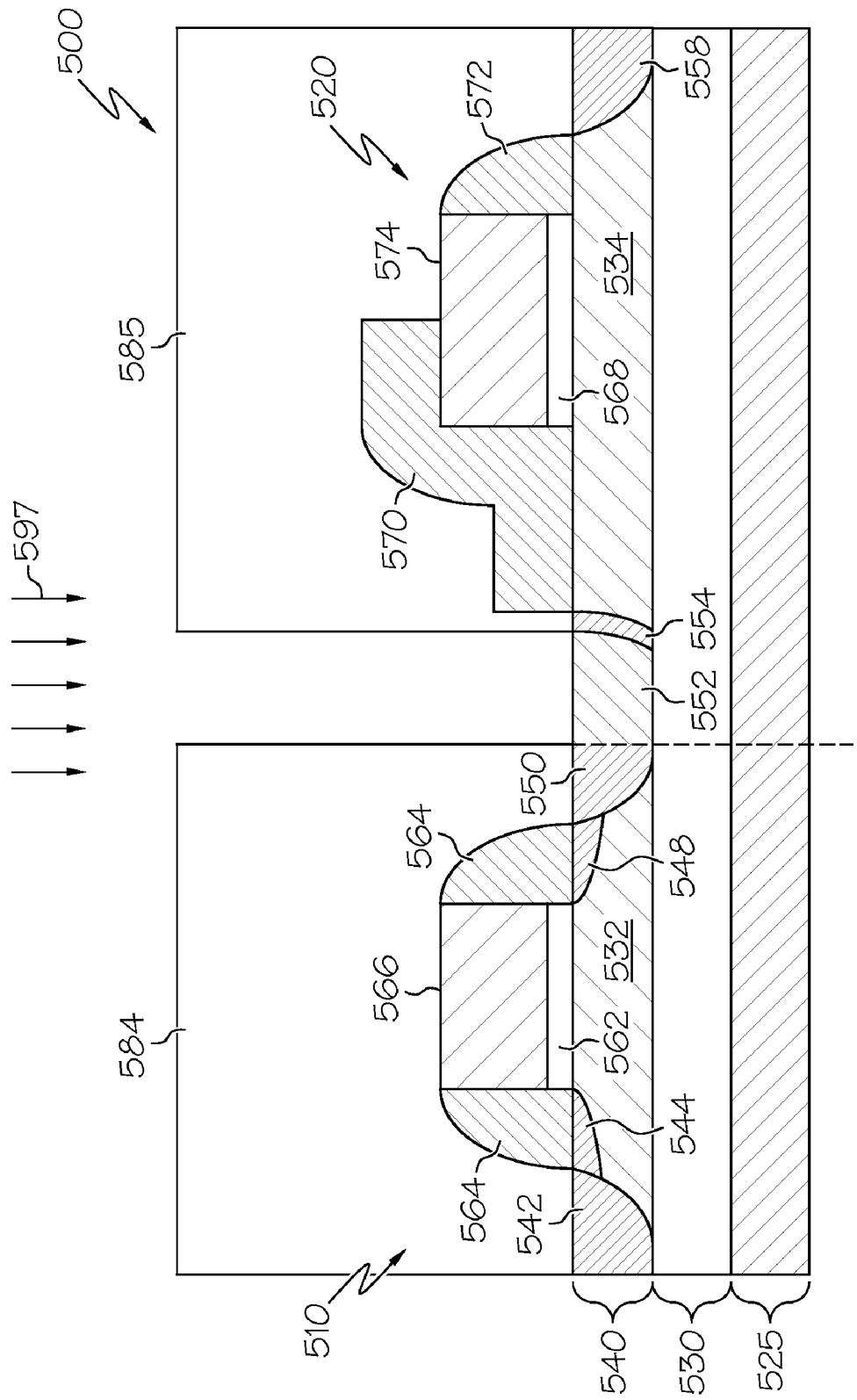

As illustrated in FIG. 10, following the implantation step illustrated in FIG. 9, an ion implant mask 584, 585 is provided over the device 500 which exposes a narrow portion of the source/base region 550, and which covers remainder of the device 500 including the NMOS transistor structure 510 and a portion of the thyristor device 520. The ion implant mask 584, 585 may comprise a patterned layer of photoresist which includes an opening which corresponds to the narrow portion of the source/base region 550. P-type conductivity determining ions, represented by the arrows 597 in FIG. 10, are implanted into the exposed narrow portion of the source/base region 550 using a high-energy ion beam to form P-type anode region 552 of the GLT device 520. Formation of the P-type anode region 552 splits the N-type source/base region 550 into two portions: an N-type source junction 550 of the access transistor 510 and an N-type base region 554 of the GLT device 520. The P-type anode region 552 is disposed between the N-type source region 550 of the access transistor 510, and the N-type base region 554 of the GLT device 520.

As illustrated in FIG. 11, a rapid thermal anneal (RTA) step is performed by exposing the memory cell 500 to controlled periods of high temperature. The RTA step electrically activates the ions in the lightly doped extension regions 544, 548, N-type drain region 542, the N-type source region 550, the P-type anode region 552, the N-type base region 554, and the N-type cathode region 558 and causes outward lateral diffusion of dopant ions implanted in those regions. A silicide region 559 can then be formed on the surface of exposed regions of the N-type drain region 542, the gate electrodes 566, 574 and the N-type cathode region 558, the N-type source region 550 and the P-type anode region 552. The silicide region 559 provides a mechanism for electrically coupling contacts to these regions including a single contact to the N-type source region 550 of the access transistor 510 and the P-type anode region 552 of the GLT device 520.

FIGS. 5, 6 and 12-14 illustrate, in cross section, the memory cell 500 and alternative method steps for its fabrication in accordance with alternate embodiments of the invention. In the exemplary embodiments illustrated in FIGS. 12-14, the N-type drain region 542, the N-type source/base region 550, and the N-type cathode region 558, can be implanted after implantation of the lightly doped extension regions 544, 548 illustrated in FIG. 6 and prior to formation of sidewall spacers 564, 572 and insulating spacer block 570.

Figure 12:
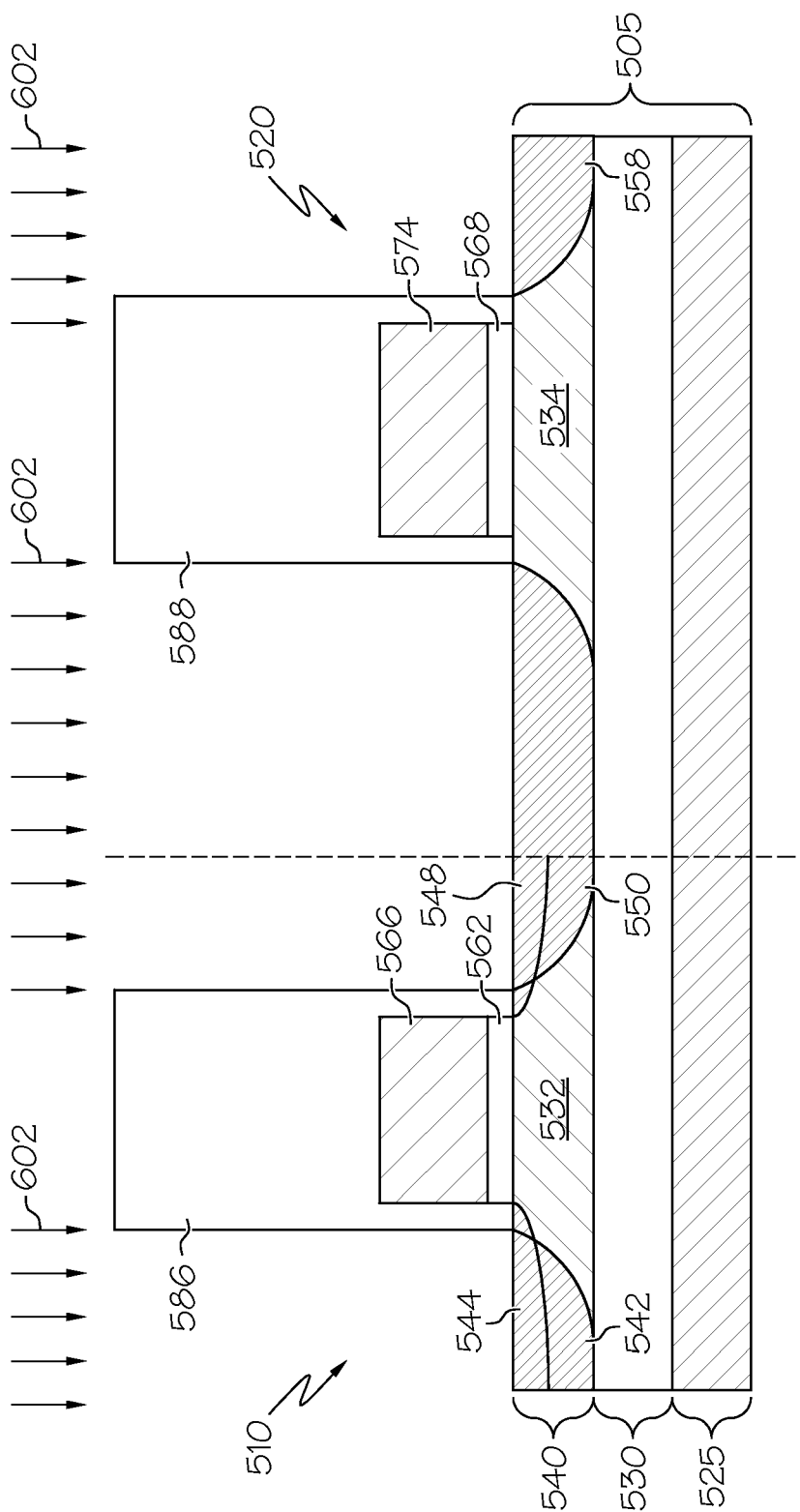

As illustrated in FIG. 12, a layer of masking material 586, 588, which can be, for example, a layer of photoresist, is then applied over the gate electrodes 566, 574. The layer of masking material is patterned to form an ion implant mask 586, 588 which exposes regions of the semiconductor layer 540 which correspond to the eventual locations of the drain region 542, the source/base region 550, and the cathode region 558. Drain region 542, source/base region 550, and cathode region 558 are implanted as represented by the arrows 602. In this exemplary embodiment, N-type conductivity determining ions, such as phosphorus or arsenic, are implanted. In an alternate embodiment, P-type conductivity determining ions, such as boron, can be implanted into the exposed regions of the semiconductor layer. The ion implant mask is then removed after implantation.

Figure 13:
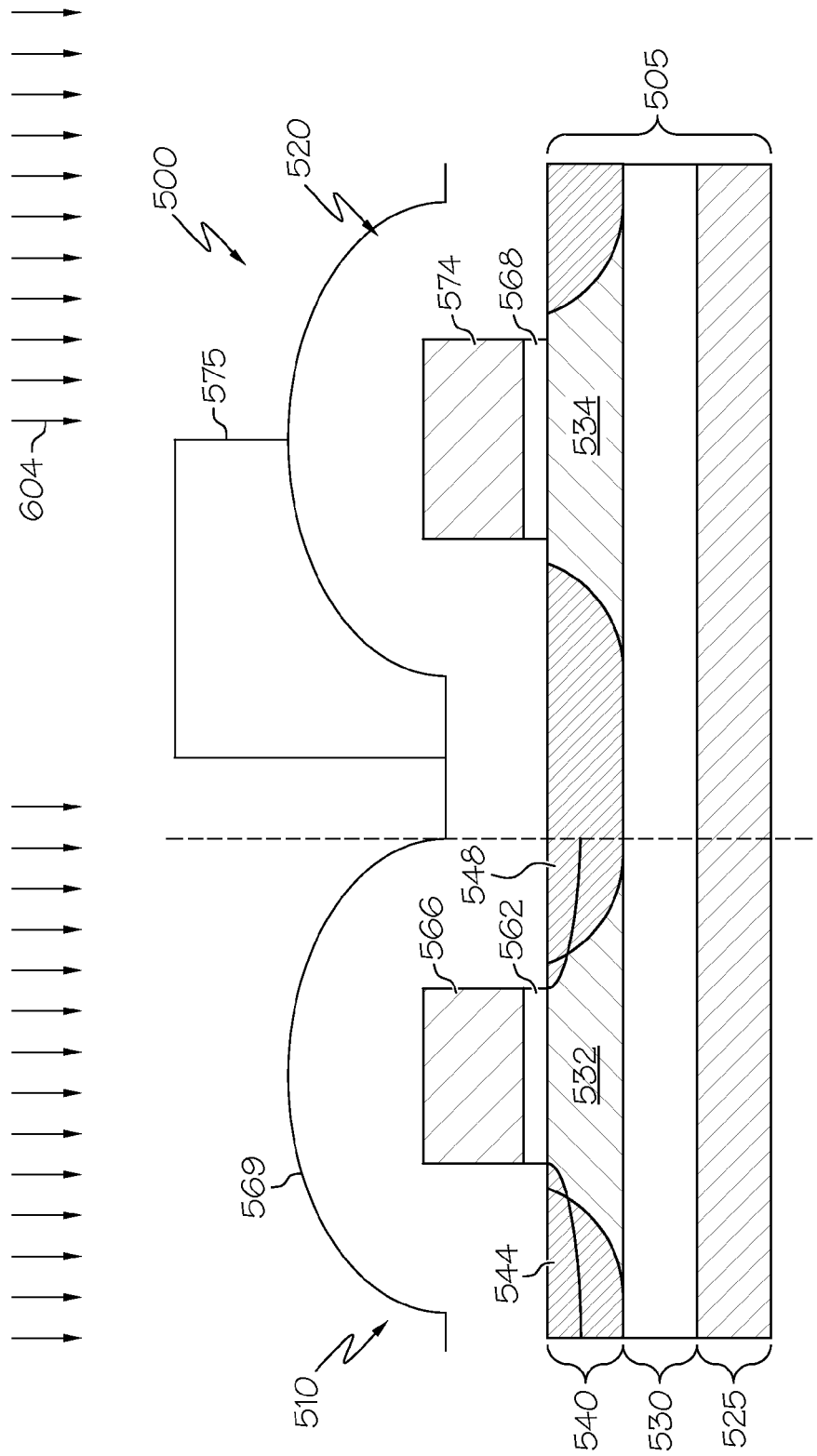

As illustrated in FIG. 13, a blanket layer of insulating material 569, such as a dielectric layer of silicon oxide and/or silicon nitride, is conformally deposited overlying the gate electrodes 566, 574 and the exposed portions of the semiconductor layer 540 including the lightly doped extension regions 544, 548, the N-type source/base region 550, the N-type drain region 542, and the N-type cathode region 558 in the semiconductor layer 540. A layer of photosensitive material, such as photoresist, is applied over the blanket layer of insulating material 569, and is patterned to leave a remaining portion 575 and to expose selected portions of the blanket insulating layer 569. The exposed portions of the blanket insulating layer 569 are then anisotropically etched with etchants represented by the arrows 604 in FIG. 13, for example, by reactive ion etching (RIE). Silicon oxide and silicon nitride can be etched, for example, in a $CHF_3$, $CF_4$, or $SF_6$ chemistry.

Figure 14:
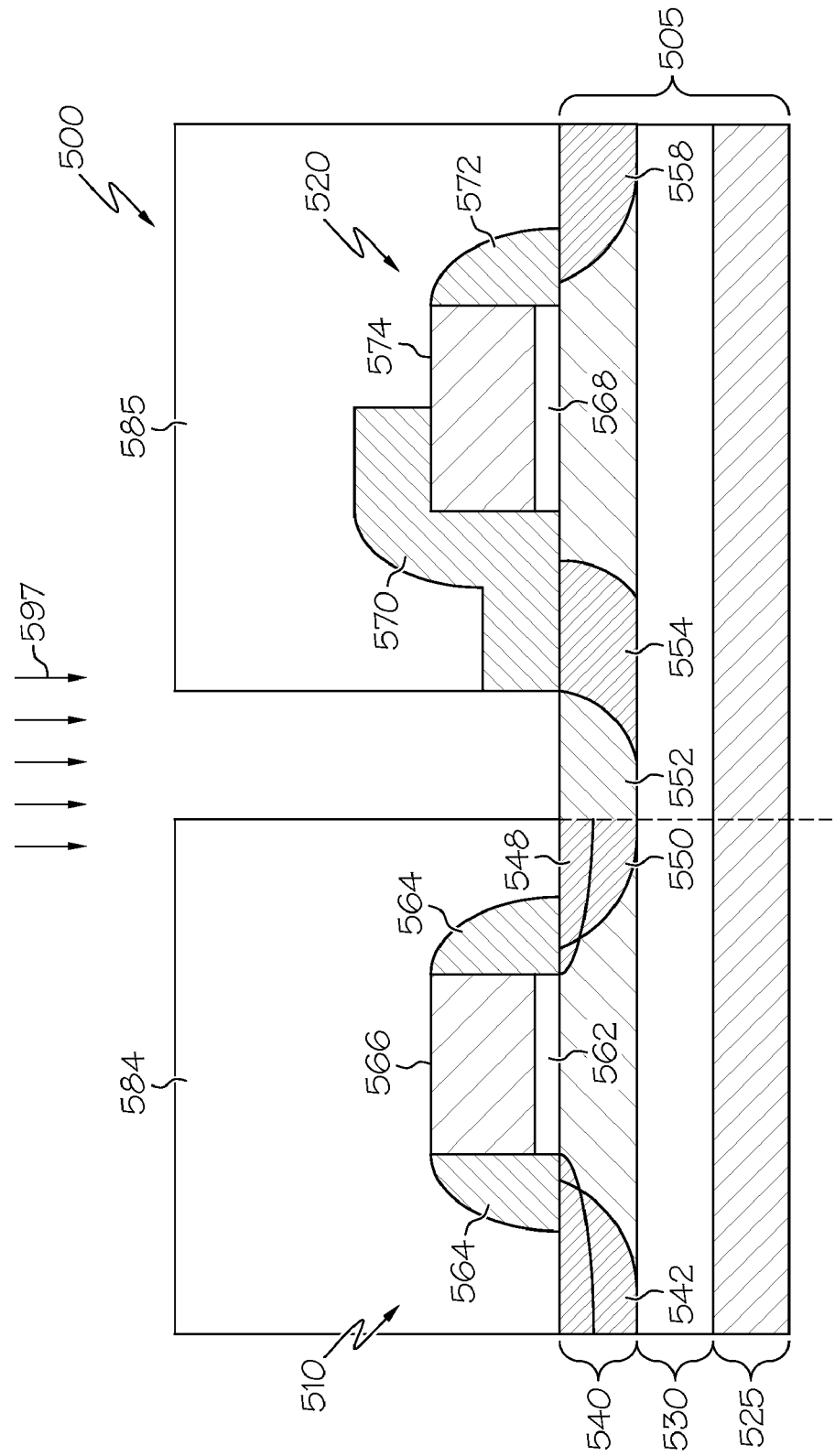

As illustrated in FIG. 14, the blanket layer of insulating material 569 is anisotropically etched to form sidewall spacers 564 on sidewalls of gate electrode 566 and to form a sidewall spacer 572 and an insulating spacer block 570 on sidewalls of gate electrode 574. The insulating spacer block 570 overlies a portion of the source/base region 550, a portion of gate electrode 574, and a sidewall of gate electrode 574. The remaining portion 575 of the photosensitive material is then removed.

An ion implant mask 584, 585 is provided over the device 500 which exposes a narrow portion of the source/base region 550, and which covers remainder of the device 500 including the NMOS transistor structure 510 and a portion of the thyristor device 520. P-type conductivity determining ions, represented by the arrows 597 in FIG. 14, are implanted into the narrow portion of the source/base region 550 using a high-energy ion beam to form P-type anode region 552 of the GLT device 520. Formation of the P-type anode region 552 splits the N-type source/base region 550 into two portions: an N-type source junction 550 of the access transistor 510 and an N-type base region 554 of the GLT device 520. The P-type anode region 552 is disposed between the N-type source region 550 of the access transistor 510, and the N-type base region 554 of the GLT device 520. Further processing is then performed as described above with reference to FIG. 11.

The memory cell 500 shown in FIG. 11 can be completed by well-known steps (not illustrated) such as depositing a layer of dielectric material, etching openings through the dielectric material, and forming metallization that extends through the openings to electrically contact the N-type drain region 542, N-type cathode region 558, the N-type source region 550 and the P-type anode region 552, and/or the gate structures. For example, layers of interconnect metallization can be formed to connect a word line to the N-type cathode region 558, to contact the gate electrodes 566, 574 which are coupled to a word lines, and to connect a bit line to the N-type drain region 542. Further layers of interlayer dielectric material, additional layers of interconnect metallization, and the like may also be applied and patterned to achieve the proper circuit function of the integrated circuit being implemented.

Thus, as illustrated in FIG. 11, the memory cell 500 comprises the NMOS access transistor 510 and the GLT device 520 fabricated adjacent the NMOS access transistor 510 on semiconductor layer 540. The GLT device 520 comprises a lateral PNPN thyristor coupled to a MOS capacitor 534, 568, 574. The lateral PNPN thyristor comprises alternating P-type and N-type material which include a P-type anode region 552, an N-type base region 554, a P-type base region 534 and an N-type cathode region 558, where the base regions 534, 554 are laterally disposed between the P-type anode region 552 and N-type cathode region 558. The N-type source region 550 of the NMOS access transistor 510 is coupled to the P-type anode region 552 of the GLT device 520. Coupling the N-type source region 550 to the P-type anode region 552 prevents the GLT device 520 from losing charge via leakage currents, for example, during a standby mode. The N-type source region 550 of the NMOS access transistor 510 blocks charge leakage from the P-type anode region 552 of the GLT device 520 because the access transistor is in an off state. A PN junction ($J_1$) is formed between P-type anode region 552 and the N-type base region 554, another PN junction ($J_2$) is formed between the N-type base region 554 and the P-type base region 534, and yet another PN junction ($J_3$) is formed between the P-type base 534 and the N-type cathode region 558. In these embodiments, the P-type anode region/N-type base region 552, 554 and the P-type base region/N-type cathode region 534, 558 function as a bipolar device. The MOS capacitor 534, 568, 574 of the GLT device 520 includes a gate electrode 574, the P-type base region 534, and a gate insulator layer 568 disposed between the gate electrode 574 and the P-type base region 534. The gate insulator layer 568 serves as the capacitor dielectric. The N-type base region 554 and the P-type base region 534 are adjacent one another. When the P-type anode region 552 is at a positive potential ($+V_A$) with respect to the N-type cathode region 558 (with no voltage applied at the gate electrode 574), then junctions $J_1$ and $J_3$ are forward biased, while junction $J_2$ is reverse biased. As $J_2$ is reverse biased, no conduction takes place (off state). If a positive potential (+$V_A$) applied to the P-type anode region 552 is increased beyond a breakdown voltage ($V_{BK}$) of the thyristor, avalanche breakdown of $J_2$ takes place and the thyristor starts conducting (on state). If a positive potential ($V_G$) is applied at the gate electrode 574 with respect to the N-type cathode region 558, the breakdown of the junction $J_2$ occurs at a lower value of the positive potential (+$V_A$). By selecting an appropriate value of $V_G$, the thyristor can be switched into the on state immediately.

The MOS capacitor 534, 568, 574 is capacitively coupled to the P-base region 534 of the thyristor, and holds charge thereby controlling potential of the P-base region 534 of the thyristor. The voltage level of the P-base region 534 determines whether or not NPN bipolar action of the N-type base region 554, the P-type base region 534, and the N-type cathode region 558 is triggered. In an alternative exemplary embodiment, the MOSFET access transistor 510 comprises a PMOS access transistor, and the GLT device 520 comprises a thyristor arranged in an NPNP configuration with the MOS capacitor is connected to an N-base of the thyristor.

As illustrated in FIGS. 4 and 11, the MOSFET access transistor 510 comprises a source region 548/550 coupled to the anode region 552 of the GLT device 520, a drain region 542/544 coupled to a bit line 450, and a gate electrode 566 coupled to a first word line 420. As will be described below with reference to FIG. 15 and with continued reference to FIGS. 4 and 11, memory cell 500 is operated using a plurality of control lines which include the first word line 420, a second word line which is coupled to the gate electrode 574 of the GLT device 520, a third word line 430 which is connected to the cathode 558 of the GLT device 520, and the bit line 450. This memory cell 500 arrangement, among other things, prevents stored charge from discharging during a write operation, as will be described below with reference to FIG. 15.

Figure 15:
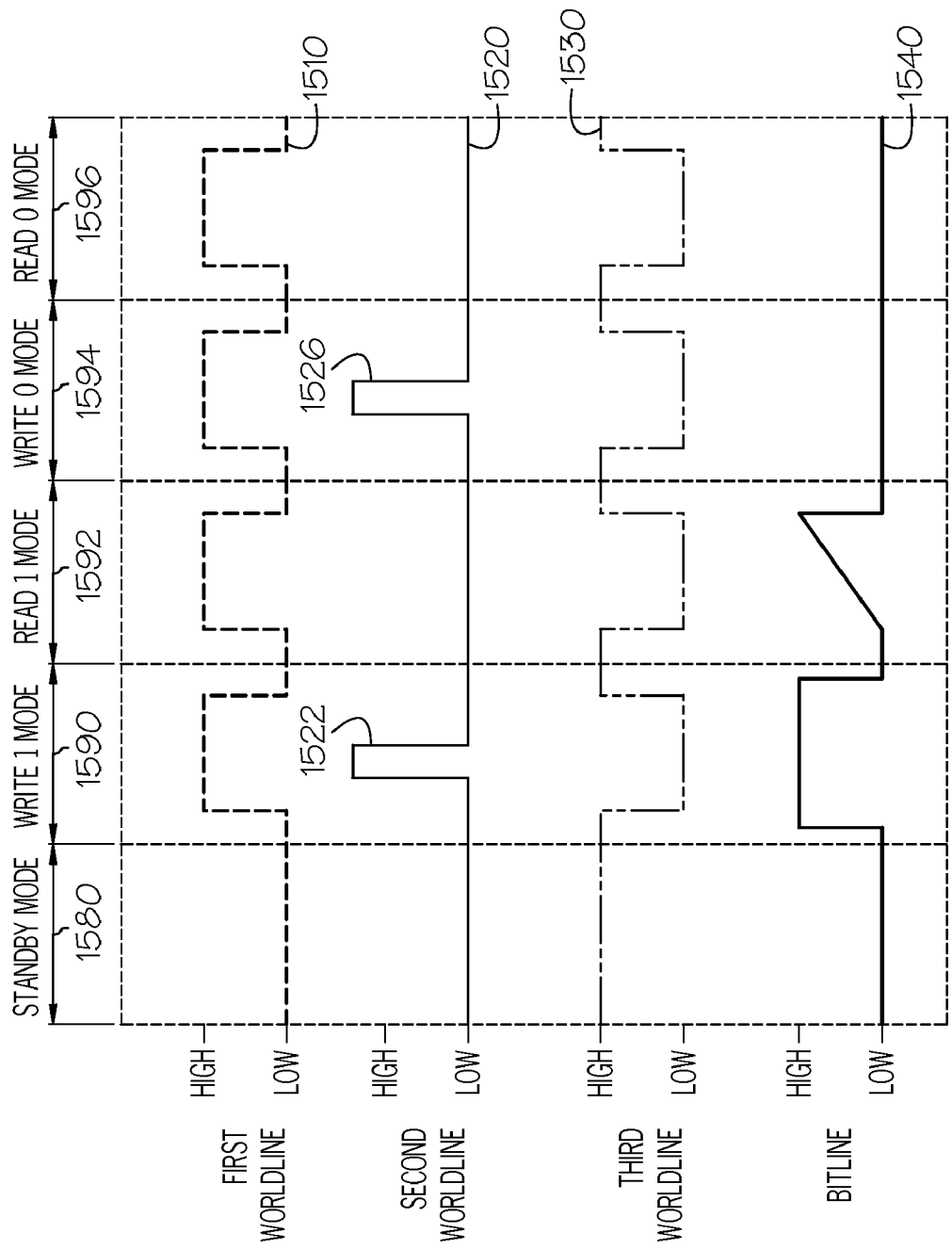
FIG. 15 is a timing diagram which illustrates voltages applied to word lines during operation of the memory cell in accordance with an embodiment of the present invention.

FIG. 15 is a timing diagram which illustrates voltage waveforms 1510, 1520, 1530 applied to word lines 420, 430, 440 of a memory cell 400 during operation of the memory cell 400 in accordance with an embodiment of the present invention. FIG. 15 will be described with reference to FIGS. 4 and 11.

The memory cell 400 illustrated in FIGS. 4 and 11 can be operated in any one of a number of different modes including standby mode 1580, write one (1) mode 1590, read one (1) mode 1592, write zero (0) mode 1594, and read zero (0) mode 1596. Voltage waveform 1510, which is applied to the first word line 420, transitions from a low level (e.g., ground or 0.0 volts) to a high level (e.g., Vdd equal to 1.2 volts) when the first word line 420 is activated. Voltage waveform 1520, which is applied to the second word line 430, transitions from a low level (e.g., −1.5 volts) to a high level (e.g., 0.0 volts) when the second word line 430 is activated during a write one (1) operation that occurs during the write one (1) mode 1590 or when the second word line 430 is activated during a write zero (0) operation that occurs during the write zero (0) mode 1594. Voltage waveform 1530, which is applied to the third word line 440, transitions from a high level (e.g., Vdd equal to 1.2 volts) to a low level (e.g., ground or 0.0 volts) when the third word line 440 is deactivated. Voltage waveform 1540 applied on the bit line 450 transitions between a high level (e.g., Vdd equal to 1.2 volts) and a low level (e.g., ground or 0.0 volts) depending on the operation mode.

In standby mode 1580, the third word line 440 is held at a high potential (Vdd) (e.g., 1.2 volts), while a negative bias voltage is applied to the second word line 430 and the bit line 450, and the first word line 420 is held at a low voltage. In one exemplary embodiment, the value of high voltage (Vdd) can be between 0.5V to 3.0V, and the value of the negative bias voltage can be between −1V to −3V.

During either write operation, the memory cell 400 is activated by applying high voltage (Vdd) to the first word line 420, and applying a low voltage to the third word line 440 to turn "on" the NMOS access transistor 510 of the memory cell 400. When the third word line 440 is at low voltage relative to the anode region 552 of the GLT device 520, no current flows in the GLT device 520 until a voltage pulse 1522 (e.g., 0.0 volts) is applied to the second word line 430. As such, when voltage pulse 1522 is applied to the second word line 430 and the third word line 440 is at low voltage relative to the anode region 552 of the GLT device 520, a current flows in the GLT device 520. For the write one (1) operation that occurs during the write one (1) mode 1590, high potential (Vdd) is applied to the bit line 450. For the write zero (0) operation that occurs during the write zero (0) mode 1594, a low voltage, for example, between 0 to 0.5V, is applied to the bit line 450.

The memory cell 400 is selected by applying high voltage (Vdd) to the first word line 420 and applying a low voltage to or grounding the third word line 440 to turn "on" the NMOS access transistor 510 of the memory cell 400. To read the memory cell 400 in read one (1) mode 1592, the bit line 450 is pre-charged to ground (0.0 volts). If the level of the pre-charged bit line 450 is charged up, then the sense amplifier circuit identifies that a data "1" is being read. To read the memory cell 400 in read zero (0) mode 1596, the bit line is pre-charged to ground (0.0 volts). If the level of the pre-charged bit line 450 has not changed, then the sense amplifier circuit identifies that data "0" is being read.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A memory device, comprising:
  a plurality of memory cells, each of said memory cells comprising:
    a bit line;
    a first word line;
    a second word line;
    a third word line;
    an access transistor comprising:
      a source node coupled to a first node;
      a first gate electrode coupled to a second node and to the first word line; and
      a drain node coupled to the bit line at a third node; and
    a gated lateral thyristor (GLT) device comprising:
      an anode node directly connected to the source node at the first node;
      a second gate electrode coupled to the second word line; and
      a cathode node coupled to the third word line at a fourth node, wherein the source node of the access transistor prevents charge leakage from the anode node of the GLT device.

2. A memory device according to claim 1, wherein the access transistor, comprises:

a N-channel field effect access transistor comprising an N-type source region.

3. A memory device according to claim 2, wherein the GLT device, comprises:
  a first PN device comprising a P-base;
  a second PN device adjacent the first PN device, wherein the second PN device comprises a P-type anode region, and wherein the N-type source region of the N-channel field effect access transistor blocks charge leakage from the P-type anode region; and
  a capacitor capacitively coupled to the P-base of the first PN device, wherein the capacitor controls potential of the P-base of the first PN device.

4. A memory device according to claim 1, wherein the access transistor, comprises:
  a P-channel field effect access transistor comprising a P-type source region.

5. A memory device according to claim 4, wherein the GLT device, comprises:
  a first NP bipolar device comprising a N-base;
  a second NP bipolar device adjacent the first NP bipolar device, wherein the second NP device comprises an N-type anode region, and wherein the P-type source region of the P-channel field effect access transistor blocks charge leakage from the N-type anode region; and a capacitor capacitively coupled to the N-base of the first NP bipolar device, wherein the capacitor controls potential of the N-base of the first NP device.

6. A memory device according to claim 1, wherein the anode node is directly electrically connected to the source node of the access transistor.

7. An integrated circuit, comprising:
  a memory cell comprising:
    a first word line;
    a second word line;
    a third word line;
    a bit line;
    an access transistor comprising:
      a source node coupled to a first node;
      a first gate electrode coupled to a second node, wherein the gate electrode is coupled to the first word line;
      a drain node coupled to the bit line at a third node; and
    a gated lateral thyristor (GLT) device comprising:
      an anode node coupled to the source node at the first node;
      a second gate electrode coupled to the second word line; and
      a cathode node coupled to a fourth node; and
      the third word line coupled to the cathode node.

8. An integrated circuit according to claim 7, wherein the access transistor comprises a N-channel field effect access transistor, and wherein the GLT device, comprises: a first PN device comprising a P-base; a second PN device adjacent the first PN device; and a capacitor connected to the P-base of the first PN device.

9. An integrated circuit according to claim 7, wherein the anode node is directly electrically connected to the source node of the access transistor.

10. A memory cell, comprising:
  a first word line, a second word line and a third word line;
  a bit line;
  an access transistor comprising a source node coupled to a first node, a first gate electrode coupled to the first word line, and a drain node coupled to the bit line; and
  a gated lateral thyristor (GLT) device comprising an anode node coupled to the source node of the access transistor at the first node, a second gate electrode coupled to the second word line, and a cathode node coupled to the third word line.

11. A memory cell according to claim 10, wherein the access transistor, comprises:
  a N-channel field effect access transistor.

12. A memory cell according to claim 11, wherein the GLT device, comprises:
  a first PN device comprising a P-base;
  a second PN device adjacent the first PN device; and
  a capacitor connected to the P-base of the first PN device.

13. A memory cell according to claim 10, wherein the access transistor, comprises:
  a P-channel field effect access transistor.

14. A memory cell according to claim 13, wherein the GLT device, comprises:
  a first NP bipolar device comprising a N-base;
  a second NP bipolar device adjacent the first NP bipolar device; and
  a capacitor connected to the N-base of the first NP bipolar device.

15. A memory cell according to claim 10, wherein the anode node is directly electrically connected to the source node of the access transistor.

* * * * *